United States Patent
Takagi et al.

[11] Patent Number: 5,900,054
[45] Date of Patent: May 4, 1999

[54] METHOD OF MANUFACTURING OXIDE SINGLE CRYSTAL

[75] Inventors: Hiroshi Takagi, Ohtsu; Makoto Kumatoriya, Omihachima; Tsuguo Fukuda, Sendai, all of Japan

[73] Assignee: Murata Manufacturing Co., Ltd., Japan

[21] Appl. No.: 08/938,265

[22] Filed: Sep. 26, 1997

[30] Foreign Application Priority Data

Oct. 2, 1996 [JP] Japan .................................. 8-281679

[51] Int. Cl.⁶ .................................................. C30B 15/02
[52] U.S. Cl. ............................ 117/15; 117/13; 117/936
[58] Field of Search ............................. 117/11, 13, 15, 117/19, 936, 937

[56] References Cited

U.S. PATENT DOCUMENTS

| | | | |
|---|---|---|---|
| 3,650,702 | 3/1972 | Swets | 117/36 |
| 5,100,870 | 3/1992 | Chen et al. | 505/1 |
| 5,625,202 | 4/1997 | Chai | 257/94 |

*Primary Examiner*—Felisa Hiteshew
*Attorney, Agent, or Firm*—Ostrolenk, Faber, Gerb & Soffen, LLP

[57] ABSTRACT

Provided is an oxide single crystal of large size having the crystal structure of $Ca_3Ga_2Ge_4O_{14}$ and containing Ge as a constituent element and a method of manufacturing thereof. The oxide single crystal is obtained by a manufacturing method comprising the steps of preparing a melt of starting materials containing $GeO_2$ and growing said oxide crystal from said melt of starting materials in single-crystal growing atmosphere, which is characterized in that said starting materials contain $GeO_2$ in a stoichiometrically excess amount, and/or said single-crystal growing atmosphere is a gas having an oxygen partial pressure greater than about $2 \times 10^{-1}$ atm.

15 Claims, 2 Drawing Sheets

METHOD OF MANUFACTURING OXIDE SINGLE CRYSTAL

BACKGROUND OF THE INVENTION

1. Technical Field of the Invention

The present invention relates to an oxide single crystal and a method of manufacturing it. More particularly, the oxide single crystal has the crystal structure of $Ca_3Ga_2Ge_4O_{14}$ and contains Ge as a constituent element and the method comprises the steps of preparing a melt of starting materials containing Ge, and growing said oxide crystal from said melt of starting materials in single-crystal growing atmosphere. The oxide single crystal is used as a material for piezoelectric devices (because of its piezoelectric properties) and a solid laser host material.

2. Related Art of the Invention

Since the discovery of $Ca_3Ga_2Ge_4O_{14}$ compound by B. V. Mill et al., a number of compounds of the same structure have been found as the result of substitution of constituents with other cations. Examples are $La_3Ga_5SiO_{14}$, $La_3Ga_{5.5}Nb_{0.5}O_{14}$, $La_3Ga_{5.5}Ta_{0.5}O_{14}$, and $La_3Ga_5ZrO_{14}$ which are formed by substitution of Ca with La or substitution of Ge with Ga and Si, Ga and Nb, Ga and Ta, or Ga and Zr. They have been found to have electromechanical coupling coefficients greater than that of α-quartz. They have also been found to have a crystal axis along which the temperature coefficient of frequency is zero. For these reasons, they are regarded as a promising material for the piezoelectric devices of the next generation of mobile communications equipment. The technology in this field has advanced to such an extent that in a material without Ge, $La_3Ga_5SiO_{14}$, a single crystal (an ingot having about 3 inches in diameter) can be produced easily by Czochralski method.

It is known that the La,Ga-based compound mentioned above is surpassed in electromechanical coupling coefficient by those $Ca_3Ga_2Ge_4O_{14}$ compounds in which the Ca site is replaced by an alkali metal ion or alkaline earth metal ion. Nevertheless, these compounds are not yet available in the form of a large single crystal because of many difficulties involved. For example, they have a melting point of 1300° C. or above which exceeds the vaporizing point of $GeO_2$, one of the starting materials. This leads to a product of poor quality due to its composition differs from that of the starting materials, cracking in the crystal, and gaseous impurity phases.

SUMMARY OF THE INVENTION

It is an object of the present invention to provide an oxide single crystal of large size and containing Ge as a constituent element having the crystal structure of $M_3Ga_2Ge_4O_{14}$ (M being a IA or IIA element) and a method of manufacturing thereof. By large size is meant the longest dimension of the crystal is at least about 60 mm.

The invention provides a method of manufacturing an oxide crystal of the above mentioned kind, which is characterized in that said starting materials contain $GeO_2$ in a stoichiometric excess amount, and/or said single-crystal growing atmosphere is a gas having an oxygen partial pressure greater than about $2 \times 10^{-1}$ atm, preferably about 5 to $10 \times 10^{-1}$ atm.

In the above method, the stoichiometric excess amount of the $GeO_2$ is preferably less than about 1.0 wt % and more preferably about 0.5–0.8%. Further, said gas may preferably contain an inert gas.

The invention also provides an oxide single crystal obtained by the above method.

In the above oxide single crystal, the Ca site of $Ca_3Ga_2Ge_4O_{14}$ may be replaced by one or more alkali metal ion or alkaline earth metal ion.

In the above oxide single crystal, said oxide single crystal may be $Sr_3Ga_2Ge_4O_{14}$.

Because $GeO_2$ begins to evaporate at 1250° C. or above in air (in which the oxygen partial pressure is $2 \times 10^{-1}$ atm) and an oxide of $Ca_3Ga_2Ge_4O_{14}$ crystal structure containing Ge as a constituent element has a melting point higher than this temperature, the evaporation of $GeO_2$ from this oxide at its melting point is inevitable.

The present invention, to cope with this situation, is designed to grow the single crystal from a melt of the starting material containing $GeO_2$ in an excess amount which would make up for the evaporation loss of $GeO_2$. The excess amount is less than about 1 wt % in view of the fact that the evaporation of $GeO_2$ from the melt of starting materials is less than about 1 wt % during crystal growth.

To suppress the evaporation of $GeO_2$, the present invention is also designed to grow the single crystal in an atmosphere in which the oxygen partial pressure is higher than that of air ($2 \times 10^{-1}$ atm).

The present invention produces the following effects: (1) Production of an oxide single crystal of large size having the crystal structure of $Ca_3Ga_2Ge_4O_{14}$ and containing Ge as a constituent element by growth from a melt of starting materials without change in composition due to evaporation loss of $GeO_2$ from the melt; (2) Suppression of evaporation of $GeO_2$; and (3) Production of a high-quality oxide single crystal of large size having the crystal structure of $Ca_3Ga_2Ge_4O_{14}$ and containing Ge as a constituent element.

These and other objects of the invention will become more apparent from the following description of the invention which refers to the accompanying drawings.

PREFERRED EMBODIMENTS OF THE INVENTION

The following two examples demonstrate methods for manufacturing $Sr_3Ga_2Ge_4O_{14}$ single crystals as an oxide single crystal which has the crystal structure of $Ca_3Ga_2Ge_4O_{14}$ and contains Ge as a constituent element.

EXAMPLE 1

Figure 1:
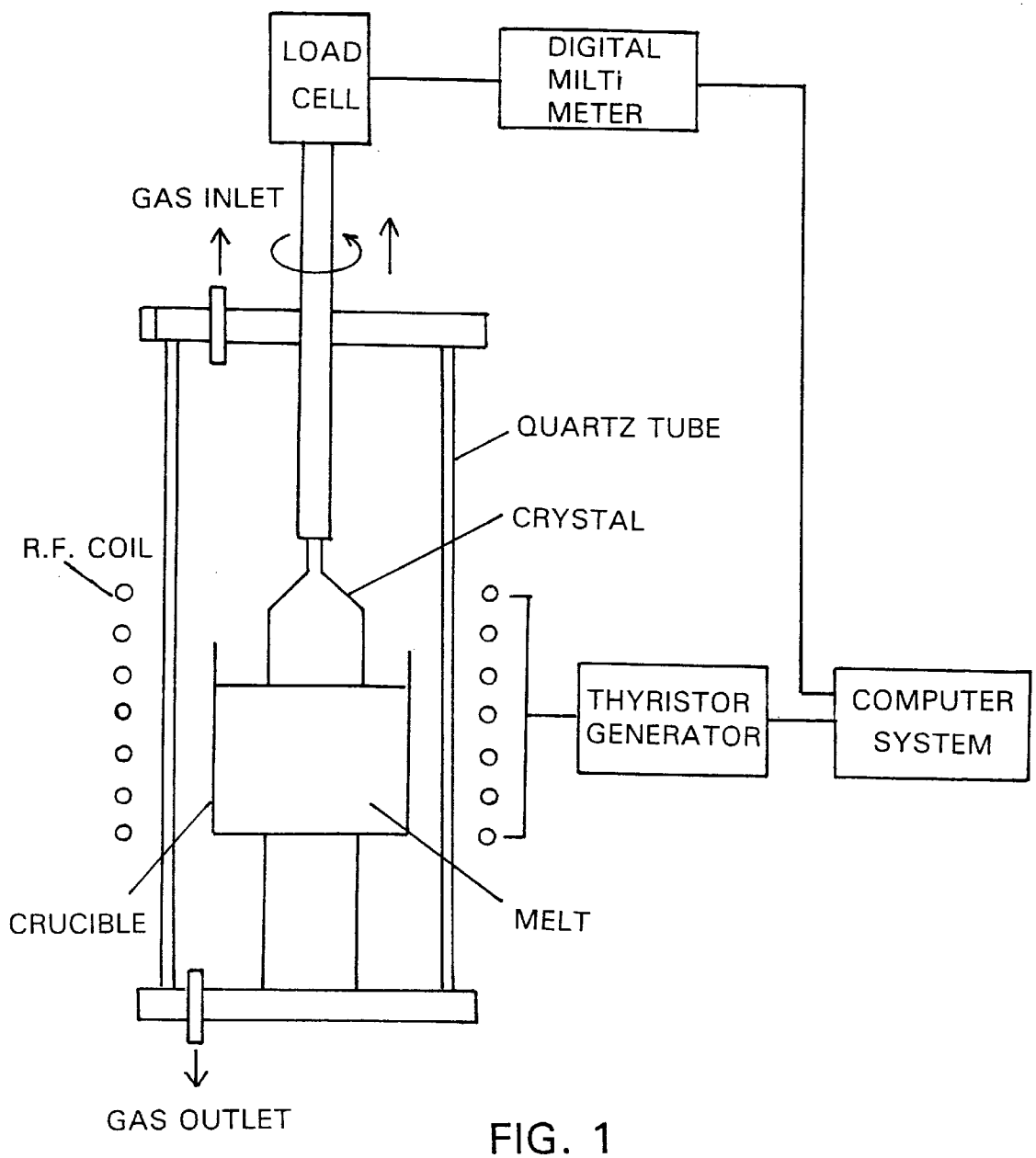
FIG. 1 is a schematic view of an apparatus for crystal-growth using Czochralski method.

$SrCO_3$, $Ga_2O_3$, and $GeO_2$ as starting materials were weighed in a molar ratio of 3:1:4. To them was further added 0.75 wt % of $GeO_2$. These components were dry mixed and then press-formed and placed in the platinum crucible shown in FIG. 1 which was 50 mm in diameter, 50 mm high, and 1.5 mm wall thickness. With radio-frequency heating, a single crystal (20 mm in diameter) was grown by Czochralski method at a crystal pulling rate of 1 mm/hour by the apparatus shown in FIG. 1. The atmosphere for crystal growth was oxygen (with the oxygen partial pressure being $2 \times 10^{-1}$ atm), and the crystal was turned continuously at a rate of 10 rpm during the crystal pulling.

During crystal growth, evaporation of a small amount of $GeO_4$ from the melt of raw materials was noticed.

Figure 2:
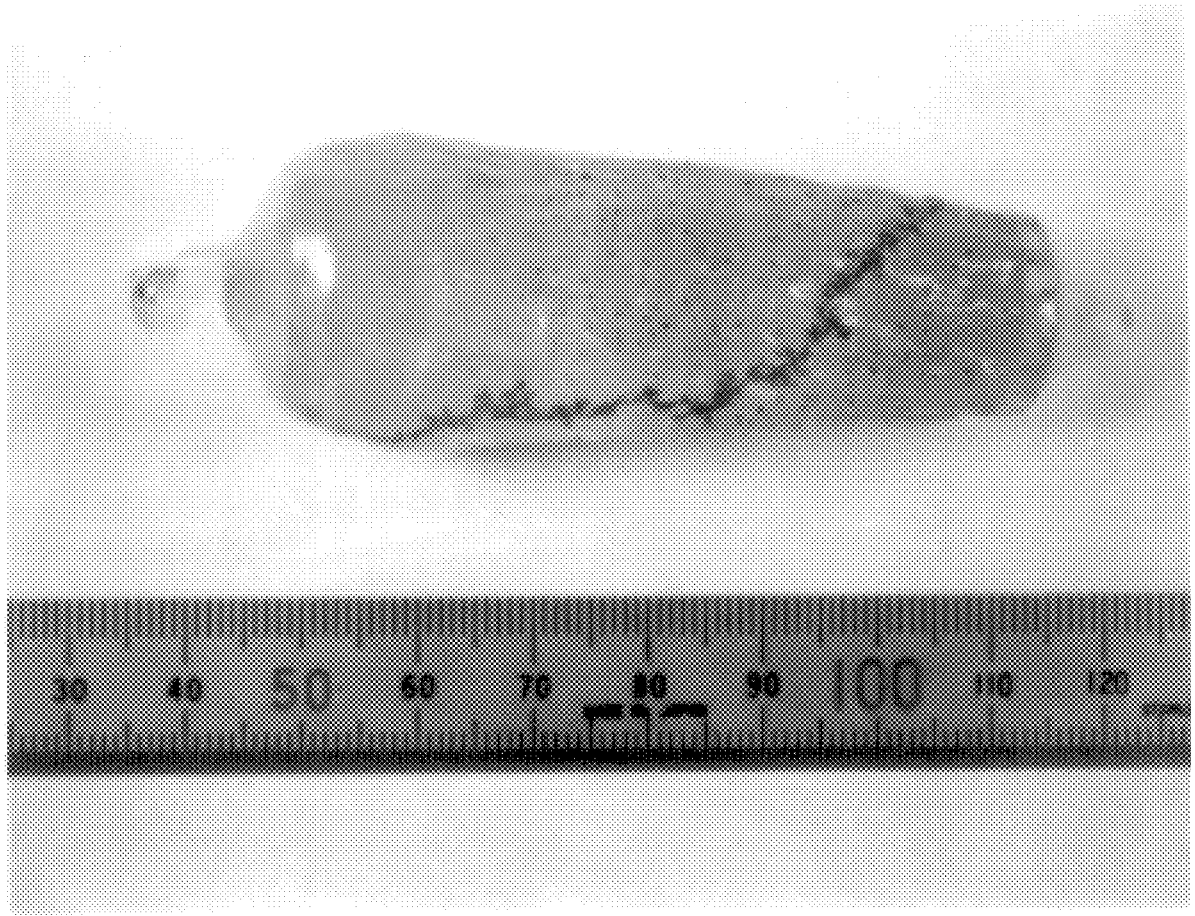
FIG. 2 shows a picture of an oxide single crystal of $Sr_3Ga_2Ge_4O_{14}$ obtained by embodiments.

Nevertheless, there was obtained a high-quality single crystal, 60 mm in length, free of bubbles and cracks as shown in FIG. 2. The results of powder X-ray diffractometry indicate that there exists only the single phase of $Sr_3Ga_2Ge_4O_{14}$ in the axis parallel to the direction of crystal pulling and that the crystal has an invariable lattice constant.

EXAMPLE 2

$SrCO_3$, $Ga_2O_3$, and $GeO_2$ as starting materials were weighed in a molar ratio of 3:1:4. These components were dry mixed and then press-formed and placed in the platinum crucible shown in FIG. 1 which was 50 mm in diameter, 50 mm high, and 1.5 mm wall thickness. With radio-frequency heating, a single crystal (20 mm in diameter) was grown by the Czochralski method at a crystal pulling rate of 1 mm/hour by the apparatus shown in FIG. 1. The atmosphere for crystal growth was oxygen (with the oxygen partial pressure being 1 atm), and the crystal was rotated continuously at a rate of 10 rpm during crystal pulling.

During crystal growth, evaporation of a small amount of $GeO_2$ from the melt of raw materials was noticed. Nevertheless, there was obtained a high-quality single crystal, 60 mm long, free of bubbles and cracks as shown in FIG. 2. The results of powder X-ray diffractometry indicate that there exists only the single phase of $Sr_3Ga_2Ge_4O_{14}$ in the axis parallel to the direction of crystal pulling and that the crystal has an invariable lattice constant.

The crystal-growing atmosphere in Example 1 should preferably contain an inert gas such as argon and nitrogen.

Although the above-mentioned examples demonstrate $Sr_3Ga_2Ge_4O_{14}$ single crystals, the present invention also covers other oxide single crystals having the crystal structure of $Ca_3Ga_2Ge_4O_{14}$ and containing Ge as a constituent element in which the Ca site is replaced by an alkali metal ion or alkaline earth metal ion, for example.

Although the present invention has been described in relation to particular embodiments thereof, many other variations and modifications and other uses will become apparent to those skilled in the art.

What is claimed is:

1. A method of manufacturing an oxide crystal containing Ge as a constituent element and having a crystal structure of $M_3Ga_2Ge_4O_{14}$, in which M is at least one IA or IIA metal, comprising the steps of;

preparing a melt of starting materials containing $GeO_2$, and growing said oxide crystal from said melt of starting materials in single-crystal growing atmosphere, characterized in that (a) said starting materials contain $GeO_2$ in a stoichiometrically excess amount, or (b) said single-crystal growing atmosphere is a gas having an oxygen partial pressure greater than about $2\times10^{-1}$ atm or (c) said starting materials contain $GeO_2$ in a stoichiometrically excess amount and said single-crystal growing atmosphere is a gas having an oxygen partial pressure greater than about $2\times10^{-1}$ atm.

2. A method according to claim 1, characterized in that said starting materials contain $GeO_2$ in a stoichiometrically excess amount.

3. A method according to claim 2, characterized in that said starting materials contain $GeO_2$ in a stoichiometrically excess amount of less than about 1.0 wt %.

4. A method according to claim 3, characterized in that said starting materials contain $GeO_2$ in a stoichiometrically excess amount of about 0.5–0.8 wt %.

5. A method according to claim 4 characterized in that said single-crystal growing atmosphere is a gas having an oxygen partial pressure greater than about $2\times10^{-1}$ atm.

6. A method according to claim 5, characterized in that said single-crystal growing atmosphere is a gas having an oxygen partial pressure of about $5-10\times10^{-1}$ atm.

7. A method according to claim 6, characterized in that said gas contain an inert gas.

8. A method according to claim 5, characterized in that said gas contain an inert gas.

9. An oxide single crystal produced by the method according to claim 5.

10. An oxide single crystal produced by the method according to claim 2.

11. A method according to claim 1, characterized in that said single-crystal growing atmosphere is a gas having an oxygen partial pressure greater than about $2\times10^{-1}$ atm.

12. A method according to claim 11, characterized in that said gas contain an inert gas.

13. A method according to claim 12, characterized in that said single-crystal growing atmosphere is a gas having an oxygen partial pressure greater than about $2\times10^{-1}$ atm.

14. An oxide single crystal produced by the method according to claim 1.

15. An oxide single crystal according to claim 14, characterized in that said oxide single crystal is $Sr_3Ga_2Ge_4O_{14}$.

* * * * *